United States Patent

Lin

[11] Patent Number: 6,093,656
[45] Date of Patent: Jul. 25, 2000

[54] METHOD OF MINIMIZING DISHING DURING CHEMICAL MECHANICAL POLISHING OF SEMICONDUCTOR METALS FOR MAKING A SEMICONDUCTOR DEVICE

[75] Inventor: Xi-Wei Lin, Fremont, Calif.

[73] Assignee: VLSI Technology, Inc., San Jose, Calif.

[21] Appl. No.: 09/031,169

[22] Filed: Feb. 26, 1998

[51] Int. Cl.[7] .................................................. H01L 21/302
[52] U.S. Cl. .......................... 438/734; 438/692; 438/633; 438/697; 438/687; 438/631; 438/672; 438/638; 438/668
[58] Field of Search ..................................... 438/692, 633, 438/697, 687, 631, 672, 734, 754, 638, 668, FOR 111; 216/88, 52

[56] References Cited

U.S. PATENT DOCUMENTS

| | | | |
|---|---|---|---|
| 4,662,064 | 5/1987 | Hsu et al. ................................... | 29/591 |
| 4,836,885 | 6/1989 | Breiten et al. ............................ | 156/643 |
| 4,944,836 | 7/1990 | Beyer et al. . | |
| 4,954,459 | 9/1990 | Avanzino et al. ........................ | 437/228 |
| 5,173,439 | 12/1992 | Dash et al. ................................. | 437/67 |
| 5,187,119 | 2/1993 | Cech et al. ................................ | 437/187 |
| 5,212,116 | 5/1993 | Yu ............................................. | 437/228 |
| 5,248,636 | 9/1993 | Davis et al. ............................... | 437/225 |
| 5,314,843 | 5/1994 | Yu et al. . | |
| 5,350,486 | 9/1994 | Huang ...................................... | 156/633 |
| 5,362,669 | 11/1994 | Boyd et al. . | |
| 5,453,639 | 9/1995 | Cronin et al. . | |
| 5,459,096 | 10/1995 | Venkatesan et al. ...................... | 437/67 |
| 5,498,565 | 3/1996 | Gocho et al. .............................. | 437/67 |
| 5,578,523 | 11/1996 | Fiordalice et al. . | |
| 5,618,381 | 4/1997 | Doan et al. . | |
| 5,662,107 | 9/1997 | Peschke et al. ........................... | 438/692 |
| 5,665,633 | 9/1997 | Meyer . | |
| 5,721,172 | 2/1998 | Jang et al. ................................. | 438/424 |
| 5,801,094 | 9/1998 | Yew et al. ................................. | 438/624 |
| 5,863,862 | 1/1999 | Snyder ...................................... | 438/437 |
| 5,936,295 | 8/1999 | Havemann et al. ....................... | 257/522 |

OTHER PUBLICATIONS

Stanley Wolf and Richard N. Tauber, "Silicon Processing for the VLSI Era", Lattice Press, vol. 1, pp. 409, 518, 1986.
Stanley Wolf and Richard N. Tauber, "Silicon Processing for the VLSI Era", Lattice Press, vol. 2, p. 193, 1990.

Primary Examiner—Charles Bowers
Assistant Examiner—Robert A. Hullinger
Attorney, Agent, or Firm—Mikio Ishimaru

[57] ABSTRACT

A method is provided for eliminating the dishing effect of the chemical mechanical polishing (CMP) process on wide inlaid conductor leads in the layer of dielectric on a semiconductor device. A silicon dioxide dielectric having narrow and wide trenches is first coated with a blanket deposition of conductor material. The conductor material is coated with a photoresist and patterned with a reverse photo image of the trenches. The photoresist is etched leaving the photoresist over the trenches and the conductor material exposed between the trenches. The conductor material is etched removing the conductor material between the trenches and leaving the original thickness of conductor material over the trenches. The remaining photoresist is removed and the conductor material subject to CMP with the original thickness of conductor material acting to prevent dishing.

13 Claims, 2 Drawing Sheets

METHOD OF MINIMIZING DISHING DURING CHEMICAL MECHANICAL POLISHING OF SEMICONDUCTOR METALS FOR MAKING A SEMICONDUCTOR DEVICE

TECHNICAL FIELD

The present invention relates generally to semiconductor manufacturing technology and more specifically to the polishing of large filled surfaces in inset trenches in the dielectric layer of semiconductors.

BACKGROUND ART

There has long been a problem with differential polishing during chemical mechanical polishing (CMP) of filled wide inset trenches, as contrasted to narrow ones, in semiconductors. Due to the abrasive nature of the slurry used, material in the center of wide trenches is abraded faster than in narrow trenches. This has gotten to be a serious problem when considering future semiconductor technology, especially if copper conductors are to be used.

Copper interconnect is believed to be the process of choice for future deep submicron semiconductor technologies. This is because of copper's low resistivity and high electromigration resistance as compared with aluminum which is currently used for interconnects. One of the key enabling elements of the copper interconnecting process is Damascene. Damascene involves inlay of copper in preformed inset trenches in the silicon dioxide dielectric layer of a semiconductor device. This is accomplished by an overall deposition of copper, followed by chemical mechanical polishing down to the surface of the silicon dioxide dielectric layer to form the copper metal interconnect wires.

A long time problem using copper interconnects has been that copper CMP along wide interconnect lines are subject to thinning out or dishing as a result of the high polishing rate in the center of wide areas. As a result, affected copper thickness will be thinner for wide lines than for narrow ones, resulting in a smaller sheet resistance and jeopardizing the integrity of interconnections for high performance device applications.

While there have been a number of different approaches to solving the dishing problem, none have provided a straight forward processing system utilizing the essential elements of standard semiconductor manufacturing techniques of photolithography and photolithographic processing.

DISCLOSURE OF THE INVENTION

The present invention provides a method of eliminating the dishing effect of the chemical mechanical polishing (CMP) process and for planarizing the inlaid conductor leads with the surface of the layer of dielectric on a silicon substrate during the manufacture of semiconductor devices. The method follows a blanket deposition of conductor material combined with photolithographic processing and an etching process to leave excess conductor material on the inlaid areas where the CMP can be carried out without dishing due to the excess material.

The present invention provides the advantage of providing narrow and wide copper interconnects with uniform sheet resistance and high integrity for high performance device applications.

The present invention provides the additional advantage of reduced polishing time and thus less copper loss over wide areas.

The present invention further provides a system of increasing the throughput of the CMP process.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
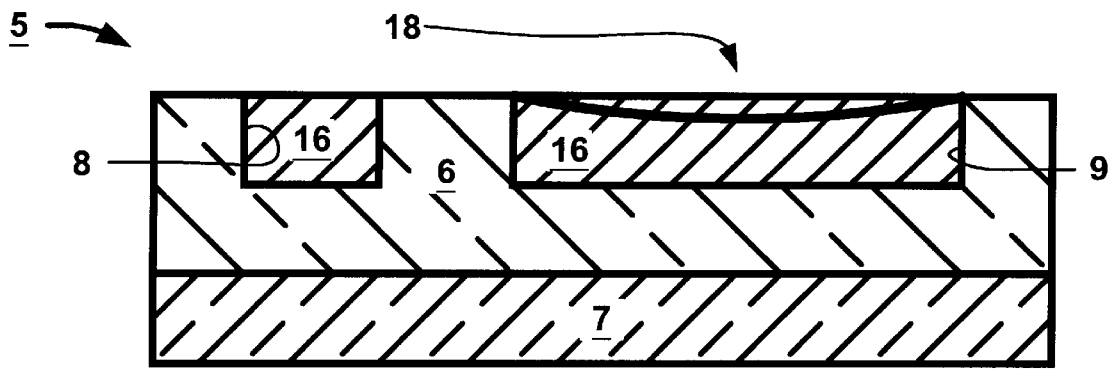
FIG. 1 is a cross-section of a prior art semiconductor after the copper inlay and chemical mechanical polishing.

Referring now to FIG. 1, therein is shown a cross section of a prior art semiconductor device 5 having a layer of dielectric 6 on a silicon substrate 7. The layer of dielectric 6 is generally of silicon dioxide and has provided therein a narrow trench 8 and a wide trench 9. Filling the narrow and wide inset trenches 8 and 9 is the copper 16 which has been subject to chemical mechanical polishing according to the prior art system. In the prior art, a blanket layer of copper was deposited over the surface of the layer of dielectric 6 and in the narrow and wide inset trenches 8 and 9. After chemical mechanical polishing (CMP), the prior art copper 16 in the wide trench 9 has a concave surface or dishing 18. This dishing 18 is due to the high polishing rate which occurs in the center of wide areas as compared to narrow areas.

This dishing 18 shows how the thickness of copper 16 in the wide trench 9 is reduced so that the sheet resistance is higher than it should be for the proper thickness of copper as in the narrow trench 8. This would further mean that there may be insufficient conduction capability to carry the currents necessary for high performance device applications.

Figure 2:
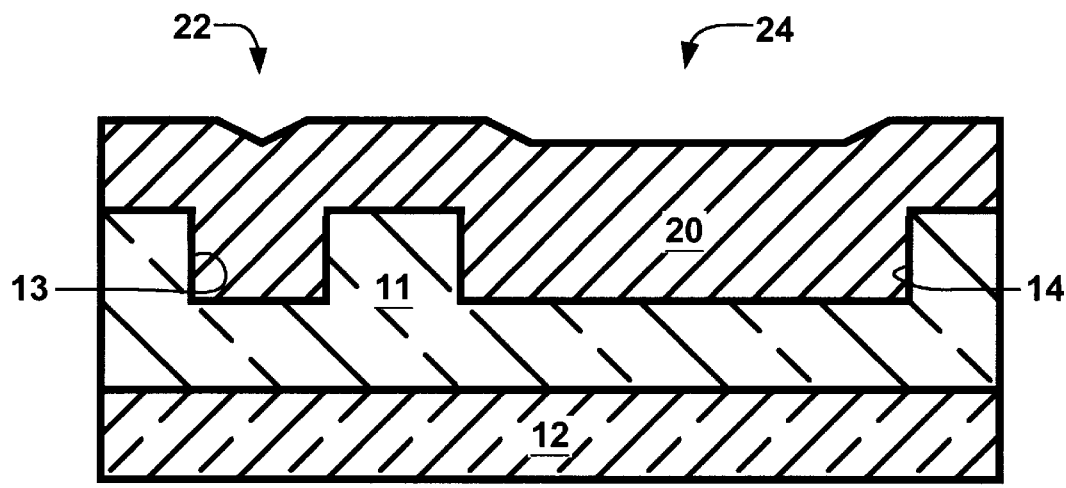
FIG. 2 is a cross section of the present invention showing a semiconductor after a blanket copper deposition on the inset trenches in the layer of dielectric.

Referring now to FIG. 2, the same elements as in the prior art are given the same numbers to simplify explanation. Thus, therein is shown the semiconductor device 10 having the layer of dielectric 11 on the silicon substrate 12. Also shown are the narrow trench 13 and the wide trench 14 inset in the layer of dielectric 11 of the semiconductor device 10.

In FIG. 2, therein is shown the layer of dielectric 11 having a layer of copper 20 deposited thereon and filling the narrow and wide inset trenches 13 and 14. Since the copper 20 is deposited as a conformal layer of uniform thickness, the surface of the copper 20 has indentations 22 and 24, respectively, roughly paralleling the bottoms of the narrow and wide inset trenches 12 and 14.

Figure 3:
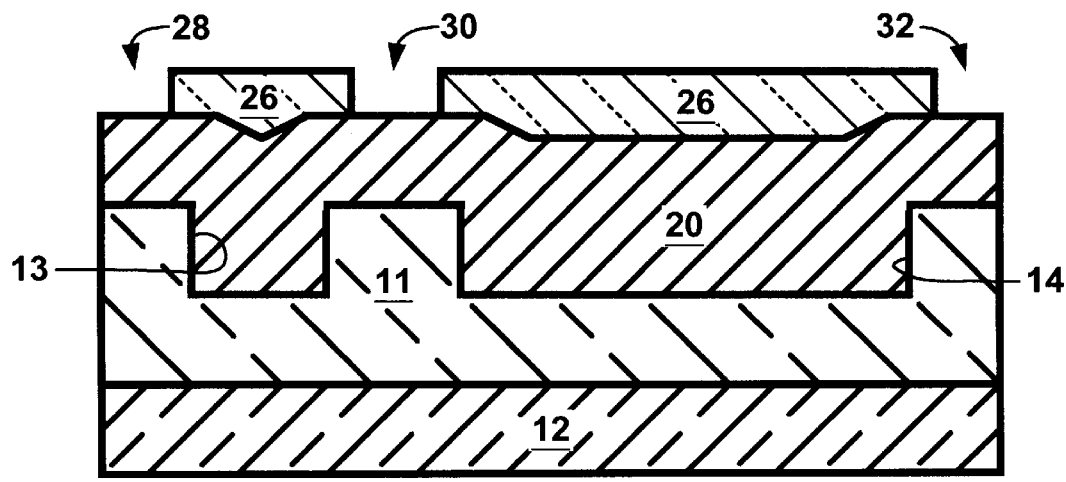
FIG. 3 is a cross section of the blanket copper deposition after photoresist patterning using a reverse mask and developing of the photoresist.

Referring now to FIG. 3, therein is shown photoresist 26 after it has been patterned and processed to allow portions 28, 30, and 32 to be removed to expose the surface of the copper 20.

Figure 4:
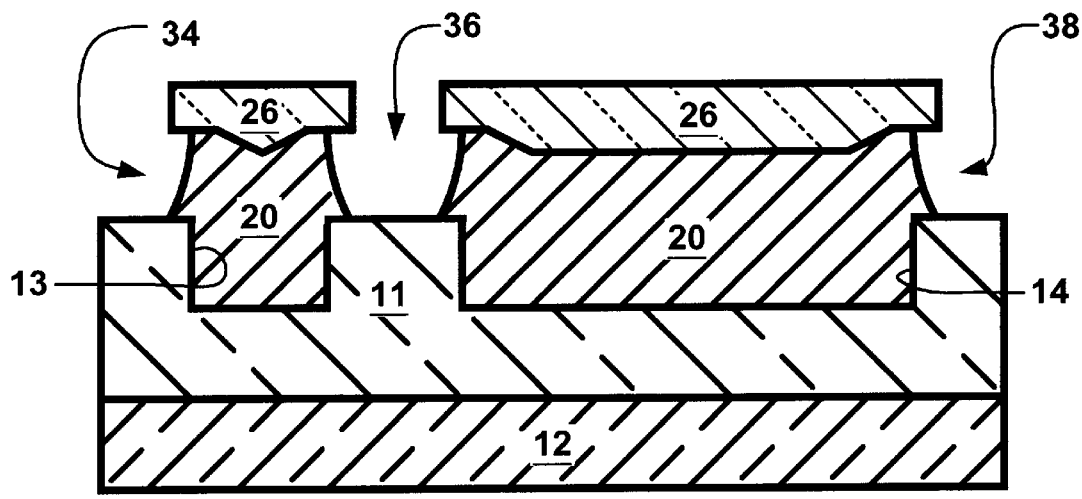
FIG. 4 is a cross section of the semiconductor after wet etching of the copper to the layer of dielectric.

Referring now to FIG. 4, therein is shown the copper 20 after it has been etched to remove copper 20 at areas 34, 36, and 38. The copper 20 is etched until the surface of the layer of dielectric 11 is exposed and the copper 20 is no longer connected between the narrow trench 13 and the wide trench 14.

Figure 5:
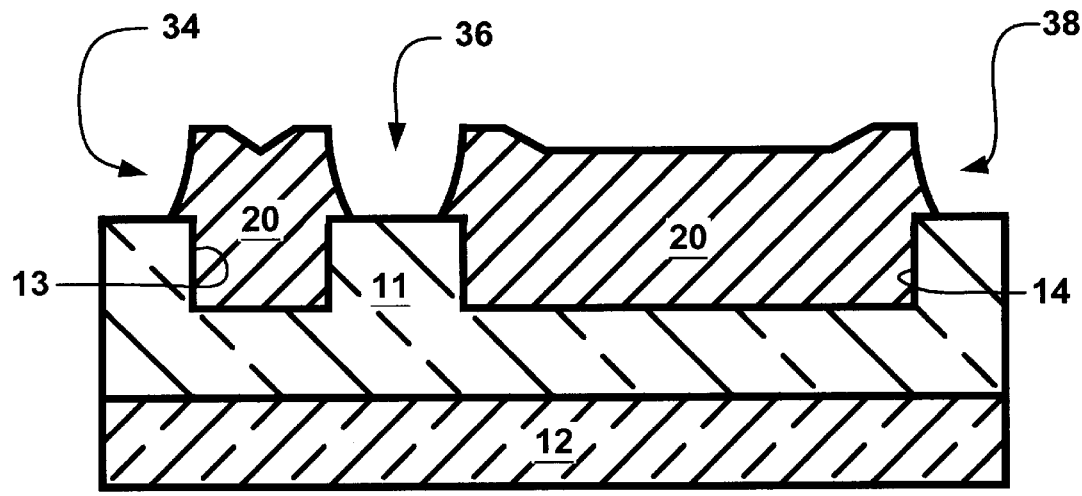
FIG. 5 is a cross section of the semiconductor after stripping the photoresist but before chemical mechanical polishing.

Referring now to FIG. 5, therein is shown the layer of dielectric 11 and the copper 20 after the photoresist 26 is stripped away.

Figure 6:
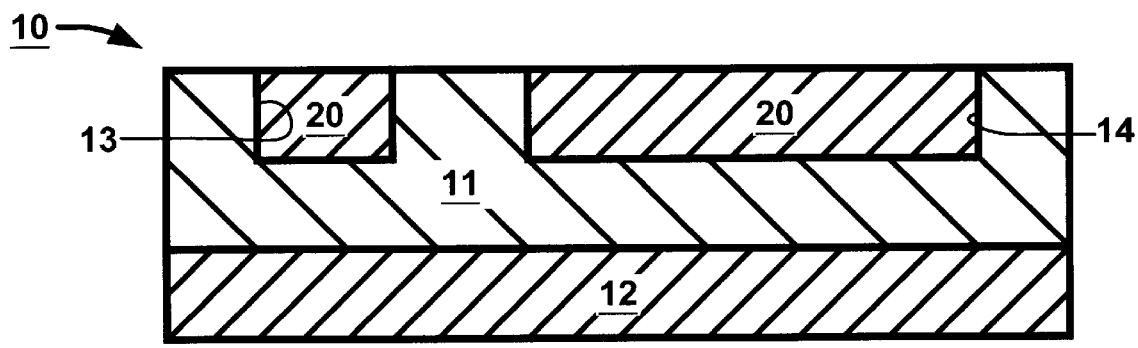
FIG. 6 is a cross section of the semiconductor with the copper inlay in the dielectric after chemical mechanical polishing.

Referring now to FIG. 6, therein is shown the semiconductor device 10, the layer of dielectric 11, and the copper 20 after copper CMP.

In the method of the present invention, the silicon substrate 12 is processed, as would be evident to those skilled in the art, to the point at which the layer of dielectric 11 is prepared for the inlay of copper into the conductor trenches. It should be noted that the layer of dielectric 11 is often coated with an additional barrier material such as tantalum or titanium nitride to minimize the migration of copper 20 into the layer of dielectric 11 to the silicon substrate 12. However, for the purposes of the present invention, the barrier material is of such thickness and so well know in the art that only this reference is made to it.

The layer of dielectric 11 is then covered by the copper 20 in a blanket copper deposition, as shown in FIG. 2. The deposition could be done in a number of different ways including conventional vacuum deposition. The copper 20 coats the surface of the layer of dielectric 11 and fills the inset trenches 13 and 14. Since the copper 20 is laid down in a constant thickness as a conformal blanket, the depressions 22 and 24 will appear at the top of the copper surface, as also shown in FIG. 2.

The silicon wafer with its copper 20 is next spin coated with the positive photoresist 26 and soft-baked to removed excess solvent. This is part of the conventional photolithography process used in the manufacture of semiconductors. The photoresist would merely appear as an additional layer above the copper 20.

The positive photoresist 26 is then aligned and exposed in a conventional patterning process in a conventional photolithographic system (not shown) using a photo mask which contains substantially a reverse image of the inset trenches 13 and 14.

The term "substantially" is used above because the photo mask image is of a slightly different size from the actual pattern of inset trenches 13 and 14 to assure full coverage over the depressions 22 and 24 over the inset trenches 13 and 14.

The term "reverse image" is used to indicate that the photo mask image allows the passage of photolithographic light in the areas away from the trenches 13 and 14. Using a positive photoresist, which is photo- or light-softened, the photoresist will be softened in the areas away from the inset trenches 13 and 14. At the same time, areas over and slightly wider than the inset trenches 13 and 14, and filling the depressions 22 and 24, will continue to have hard photoresist.

It should be noted that negative photoresist, which is photo- or light-hardened, can also be used and the materials for development would be slightly different. Essentially, the image on the photo mask would be the negative image of the trench pattern and the photolithography would harden the negative photoresist over the inset trenches 13 and 14, and filling the depressions 22 and 24.

Generally, it has been determined that a positive photoresist can transfer smaller patterns so it is better for smaller line widths than a negative photoresist.

The photoresist 26 will then be chemically developed using a chemical developing fluid to remove the softened photoresist 26 at portions 28, 30, and 32, as shown in FIG. 3.

After developing, the photoresist 26 is hard-baked to evaporate any solvents left in the newly exposed area of the resist and to increase adhesion at the edges of the photoresist pattern.

Next, the remaining photoresist 26 and the copper 20 is rinsed to remove any remaining particles of photoresist. The particular chemicals used for developing and rinsing will depend on the particular photoresist, as well known to those skilled in the art. At the end of this step, the copper 20 will be exposed between the inset trenches 13 and 14.

The next step uses an isotropic copper etch in a wet solvent such as HCl or HF. The isotropic etch removes copper at the same rate in all directions and removes copper 20 down to the layer of dielectric 11 of the semiconductor device 10 at locations 34, 36, and 38. The copper etch should not attack the photoresist 26. FIG. 4 shows the cross-section when etching is complete.

After the copper etch is rinsed off, the photoresist 26 is removed by ashing in an ozone atmosphere or an oxidizing plasma. This step should not remove any of the copper 20. The configuration of the layer of dielectric 11 and the copper 20 will be as shown in FIG. 5.

Finally, CMP is applied to remove the copper 20 until the top surface of the copper 20 is coplanar or level with the surface of the layer of dielectric 11 as shown in FIG. 6.

The process of the present invention minimizes the dishing 18 shown in FIG. 1, for two reasons. First, the thick copper over the wide inset trench 14 offsets the accelerated polishing away of copper on this wide area. Second, because of the isotropic copper etching, the total volume of copper to be removed by CMP is substantially reduced. This results in reduced polishing time and thus, less time for copper to be lost over the wide areas and for dishing to occur. Another incidental advantage of the present invention is that the throughput of the CMP process is improved because of the reduced polishing time.

While the invention has been described in conjunction with a specific best mode, it is to be understood that many alternatives, modifications, and variations will be apparent to those skilled in the art in light of the aforegoing description. For example, the same process could be used to for preventing dishing in dielectric barriers in semiconductors. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for manufacturing a semiconductor device with a conductor directly on a dielectric layer with surfaces of at least two different elevations so as to form trenches with vertical sidewalls and horizontal bottoms, comprising the steps of:

depositing a blanket of conductor on the dielectric and filling the trenches;

applying a photoresist to said conductor;

using a mask in a pattern substantially related to said pattern of trenches in a photolithographic process to pattern said photoresist;

removing said photoresist from between the trenches;

performing an isotropic conductor etch to remove said conductor from between the trenches;

removing said photoresist from said conductor; and chemical mechanical polishing of said conductor to be co-planar with the surface of the dielectric layer.

2. The method as claimed in claim 1 wherein the step of applying a photoresist includes the application of a positive photoresist.

3. The method as claimed in claim 2 wherein the step of using a mask of the trenches in a photolithographic process uses substantially a reverse mask of the trenches and exposes the photoresist between the trenches.

4. The method as claimed in claim 3 wherein the step of removing said photoresist from between the trenches uses an isotropic etch in a wet solvent.

5. The method as claimed in claim 4 wherein the step of removing said photoresist from above the trenches uses ozone.

6. The method as claimed in claim 3 wherein the step of removing said photoresist from above the trenches uses an oxidizing plasma.

7. A method for manufacturing a semiconductor device with copper conductors directly on a dielectric layer with surfaces of at least two different elevations so as to form trenches with vertical sidewalls and horizontal bottoms, comprising the steps of:

depositing a blanket of copper on the dielectric and filling the trenches;

applying a photoresist to said copper;

using a mask in a pattern substantially related to said pattern of trenches in a photolithographic process to pattern said photoresist;

removing said photoresist from between the trenches;

performing an isotropic copper etch to remove said copper from between the trenches;

removing said photoresist from said copper; and chemical mechanical polishing of said copper to be co-planar with the surface of the dielectric layer.

8. The method as claimed in claim 7 wherein the step of applying a photoresist includes the application of a positive photoresist.

9. The method as claimed in claim 8 wherein the step of using a mask of the trenches in a photolithographic process uses substantially a reverse mask of the trenches and exposes the photoresist between the trenches.

10. The method as claimed in claim 9 wherein the step of removing said photoresist from between the trenches uses an isotropic etch in a wet solvent.

11. The method as claimed in claim 10 wherein the step of removing said photoresist from above the trenches uses ozone.

12. The method as claimed in claim 9 wherein the step of removing said photoresist from above the trenches uses an oxidizing plasma.

13. A method for manufacturing a semiconductor device with a copper conductor directly on a dielectric layer with surfaces of at least two different elevations so as to form trenches with vertical sidewalls and horizontal bottoms, comprising the steps of:

depositing a blanket of copper on the dielectric and filling the trenches;

applying a positive photoresist to said copper;

using a mask which is a substantially a reverse mask of the trenches in a photolithographic process to pattern said photoresist;

removing said photoresist from between the trenches with an isotropic etch in a wet solvent leaving said photoresist covering the trenches;

performing an isotropic copper etch to remove said copper from between the trenches and leaving said copper under said photoresist;

removing said photoresist from said copper with an oxidizing plasma; and chemical mechanical polishing of said copper to be co-planar with the surface of the dielectric between the trenches.

* * * * *

UNITED STATES PATENT AND TRADEMARK OFFICE
CERTIFICATE OF CORRECTION

PATENT NO : 6,093,656
DATED : Jul. 25, 2000
INVENTOR(S) : Xi-Wei Lin

It is certified that error appears in the above-identified patent and that said Letters Patent is hereby corrected as shown below:

In Col. 3, line 22, delete "know" and insert therefor --known--

In Col. 3, line 34, delete "removed" and insert therefor --remove--

In Col. 4, line 46, delete "to"

Signed and Sealed this

Fifteenth Day of May, 2001

*Attest:*

NICHOLAS P. GODICI

*Attesting Officer*   *Acting Director of the United States Patent and Trademark Office*